US012476083B2

(12) United States Patent
Grede et al.

(10) Patent No.: US 12,476,083 B2
(45) Date of Patent: Nov. 18, 2025

(54) METHOD FOR GENERATING AN RF SIGNAL, CONTROLLER, RF GENERATOR AND PLASMA APPARATUS

(71) Applicant: COMET AG, Flamatt (CH)

(72) Inventors: André Grede, Bern (CH); Daniel Gruner, Badenweiler (DE); Anton Labanc, Ehrenkirchen (DE); Roland Schlierf, Frechen (DE); Nikolai Schwerg, Bern (CH); Manuel vor dem Brocke, Bramsche (DE)

(73) Assignee: COMET AG, Flamatt (CH)

( * ) Notice: Subject to any disclaimer, the term of this patent is extended or adjusted under 35 U.S.C. 154(b) by 250 days.

(21) Appl. No.: 18/269,697

(22) PCT Filed: Dec. 30, 2020

(86) PCT No.: PCT/EP2020/088012
§ 371 (c)(1),
(2) Date: Jun. 26, 2023

(87) PCT Pub. No.: WO2022/144080
PCT Pub. Date: Jul. 7, 2022

(65) Prior Publication Data
US 2024/0321553 A1 Sep. 26, 2024

(51) Int. Cl.
*H01J 37/32* (2006.01)

(52) U.S. Cl.
CPC .. *H01J 37/32183* (2013.01); *H01J 37/32926* (2013.01)

(58) Field of Classification Search
None
See application file for complete search history.

(56) References Cited

U.S. PATENT DOCUMENTS 5,325,019 A * 6/1994 Miller ................. H01J 37/3299 315/111.21
5,381,110 A * 1/1995 O'Leary ................. H03F 1/083 330/149

(Continued)

FOREIGN PATENT DOCUMENTS

CN 1647252 A 7/2005
EP 1895654 A1 3/2008

(Continued)

*Primary Examiner* — Srinivas Sathiraju
(74) *Attorney, Agent, or Firm* — The Webb Law Firm

(57) ABSTRACT

A method for generating an RF signal preferably for a plasma chamber including the steps of: generating an input RF signal on the basis of a first set of control parameters; detecting at least one distorted RF signal; synchronizing the at least one distorted RF signal with the input RF signal; determining a difference between a target RF signal and the at least one distorted RF signal being synchronized; if the difference is larger than a predetermined threshold, determining a second set of control parameters based on the comparison of the target RF signal and the at least one distorted RF signal being synchronized; and generating an adapted input RF signal on the basis of the second set of control parameters such that the difference between the target RF signal and the distorted RF signal is reduced.

18 Claims, 8 Drawing Sheets

(56) References Cited

U.S. PATENT DOCUMENTS

| | | | | |
|---|---|---|---|---|
| 5,568,105 | A * | 10/1996 | O'Leary | H03H 7/255 327/540 |
| 5,997,687 | A | 12/1999 | Koshimizu | |
| 6,459,067 | B1 | 10/2002 | Vona, Jr. et al. | |
| 6,902,646 | B2 | 6/2005 | Mahoney et al. | |
| 8,240,044 | B2 | 8/2012 | Shiraishi et al. | |
| 8,781,415 | B1 * | 7/2014 | Coumou | H01J 37/32935 330/149 |
| 9,876,476 | B2 | 1/2018 | Coumou et al. | |
| 10,049,857 | B2 | 8/2018 | Fisk, II et al. | |
| 10,304,669 | B1 * | 5/2019 | Coumou | H01J 37/32174 |
| 2005/0194094 | A1 | 9/2005 | Yasaka | |
| 2014/0256066 | A1 * | 9/2014 | Sato | H01L 21/3065 156/345.28 |
| 2019/0229684 | A1 * | 7/2019 | Wu | H03F 3/45179 |
| 2020/0375068 | A1 * | 11/2020 | Scherler | H05K 7/20163 |
| 2021/0074529 | A1 * | 3/2021 | Labanc | H03F 3/189 |
| 2021/0075380 | A1 * | 3/2021 | Labanc | H01J 37/32174 |
| 2021/0259090 | A1 * | 8/2021 | Labanc | H03F 1/34 |
| 2022/0060160 | A1 * | 2/2022 | Gruner | H03F 3/195 |
| 2022/0189739 | A1 * | 6/2022 | Fink | C04B 35/468 |
| 2022/0216838 | A1 * | 7/2022 | Gruner | H01J 37/32165 |
| 2023/0283282 | A1 * | 9/2023 | vor Dem Brocke | H03L 7/104 327/156 |
| 2024/0296270 | A1 * | 9/2024 | Schwerg | G06F 30/36 |
| 2024/0321553 | A1 * | 9/2024 | Grede | H01J 37/32926 |

FOREIGN PATENT DOCUMENTS

| | | | |
|---|---|---|---|
| EP | 2905801 | A1 | 8/2015 |
| EP | 3561852 | A1 | 10/2019 |
| JP | H1064696 | A | 3/1998 |
| JP | 2011109674 | A | 6/2011 |
| JP | 2016051542 | A | 4/2016 |
| JP | 2018504869 | A | 2/2018 |
| TW | 200506388 | A | 2/2005 |
| TW | 201125935 | A1 | 8/2011 |
| TW | 201713171 | A | 4/2017 |
| WO | 2014035889 | A1 | 3/2014 |
| WO | 2020069131 | A1 | 4/2020 |

* cited by examiner

METHOD FOR GENERATING AN RF SIGNAL, CONTROLLER, RF GENERATOR AND PLASMA APPARATUS

CROSS-REFERENCE TO RELATED APPLICATION

This application is the United States national phase of International Application No. PCT/EP2020/088012 filed Dec. 30, 2020, the disclosure of which is hereby incorporated by reference in its entirety.

BACKGROUND OF THE INVENTION

Field of the Invention

The present invention relates to a method for generating an RF signal, preferably for a plasma chamber of a plasma apparatus, a controller, in particular for an RF generator, and such an RF generator for generating an RF signal for a plasma chamber of a plasma apparatus. Further the present invention relates to a plasma apparatus.

Description of Related Art

Plasma processing is a very versatile and precise technique to modify the surfaces of materials, in particular in the manufacturing of semiconductor chips. Plasma processes are employed multiple times during the entire semiconductor wafer process by using plasma processing tools which are typically operated with radiofrequency (RF) power.

In such processing systems, RF power is used to excite gaseous compounds such that free electrons and ions are formed. Depending on a variety of process parameters, the plasma composition, i.e. the amount of ions, electrons, can be controlled precisely.

Signal distortion due to non-linear elements in a transmission chain is a common issue in the field of plasma processing. In many cases, unwanted distortions can cause signal deviations which impair the correct function of the application. Overshoots of the transmitted power can even cause severe malfunctions or significant damage to the processed material, e.g. a semiconductor wafer, or even the used hardware.

Solutions known from prior art for eliminating or reducing signal distortion have in common that they require dedicated hardware components to optimize certain aspects of the output characteristics in the frequency or time domain for specific applications. If requirements change significantly, hardware changes can typically not be avoided causing increased cost and prolonged down times of the systems.

US 2019/229684 A1 describes a way to reduce output harmonics by essentially using the difference between the actual output signal and a low-pass-filtered version of this signal to modify the amplifier parameters such that harmonics in the output signal are reduced.

EP 1 895 654 has a similar approach and uses dedicated circuits for distortion detection, generation of a distortion signal, and correlating output and distortion signals as input for a control circuit. In result, the power output spectrum of the amplifier can be improved in a way that frequencies off the intended one are significantly reduced.

WO 2020/069131 A1 describes a way to reduce unwanted spurious harmonics by means of filters and a dedicated modulation method.

U.S. Pat. Nos. 5,381,110 and 5,568,105A both use modification of the decay time of pulses to reduce spurious frequencies in an RF transmitter by means of a quadrature hybrid matched attenuator.

U.S. Pat. No. 5,325,019 shows hardware options (variation of cable length; use of variable capacitors) to influence harmonics in plasma voltage and current.

All these solutions have in common that they use dedicated hardware components to optimize certain aspects of the output characteristics (frequency or time domain) of specific applications. If requirements change significantly, hardware changes are typically required.

Moreover, in most of the prior art, distortions which are generated by components between the power amplifier and the load, e.g. an antenna or an impedance matching network, or by the load itself, e.g. a highly non-linear plasma burning in a plasma chamber, are completely disregarded.

Thus, it is an objective of the present invention to provide a flexible distortion compensation allowing to adapt the RF signal to the needs of the application.

SUMMARY OF THE INVENTION

The problem given above is solved by a method as described herein, a controller as described herein, an RF generator as described herein and a plasma apparatus as described herein.

The method according to the present invention generating an RF signal preferably for a plasma chamber comprises the steps of:

- Generating an input RF signal on the basis of a first set of control parameters; Detecting at least one distorted RF signal;
- Synchronizing the at least one distorted RF signal with the input RF signal; Determining a difference between a target RF signal and the at least one distorted RF signal being synchronized;
- If the difference is larger than a predetermined threshold, determining a second set of control parameters based on the comparison of the target RF signal and the at least one distorted RF signal being synchronized; and
- Generating an adapted input RF signal on the basis of the second set of control parameters such that the difference between the target RF signal and the distorted RF signal is reduced.

Thus, in the first step, an input RF signal is generated on the basis of a first set of control parameters. This input RF signal is distorted for example by non-linear elements. The distorted RF signal is detected and then synchronized with the input RF signal. Therein, one distorted signal or more than one distorted signals may be detected. By the step of synchronization the distorted RF signal with the input signal, a delay time due to signal propagation time is compensated in order to temporally match the distorted RF signal with the input RF signal.

From the synchronized distorted RF signal and the target signal a difference is determined, and if this difference is larger than a predetermined threshold, a second set of control parameters is determined on the basis of a comparison between the synchronized distorted RF signal and the target signal in order to determine a deviation between these RF signals. Thus, only if the deviation between the distorted RF signal, i.e. the distortion of the input RF signal, and the target RF signal exceeds the predetermined threshold, adaptation of the input RF signal is initiated by providing a second set of control parameters based on the comparison of the synchronized distorted RF signal and the target RF signal. If a second set of control parameters is determined, an adapted input RF signal is generated on the basis of the second set of control parameters in order to reduce the difference between the target RF signal and the distorted RF signal.

In accordance with the present invention, the distorted RF signal approaches in an iterative process the target RF signal in order to provide a reliable plasma processing in the plasma chamber. Thus, upon change of the requirements of the target RF signal, pre-compensation of the distortion is applied to provide an input RF signal such that the distorted RF signal, i.e. the RF signal provided to the plasma chamber, approximates the target RF signal. Therein, the RF signal can be an amplitude-modulated envelope of an RF base frequency in the time-domain (e.g. pulse pattern) or a multi-frequency spectrum (e.g. a base frequency surrounded by additional frequencies, or multiple distinct frequencies) in the frequency domain. In particular, the target RF signal is the intended signal provided by the customer or the recipe of the plasma processing without distortions in order to provide reliable and stable plasma conditions. The input RF signal is the signal generated by an RF generator as described below and provided to the plasma chamber via a transmission chain. Therein, the input RF signal might be an amplified signal, or an RF signal provided to an amplifier. Therein, the input RF signal may differ from the target RF signal in that the input RF signal pre-compensates the distortions of the power amplifier of the RF generator and the distortions of the transmission chain from the RF generator to the plasma chamber. Further, the distorted RF signal is the signal distorted by the amplifier of the RF generator and the transmission chain between the RF generator and the plasma chamber, being the RF signal provided to the plasma chamber which shall be as close as possible to the target RF signal at the plasma chamber, wherein the similarity between the target RF signal and the distorted RF signal is determined according to the predetermined threshold. Hence, due to the provided method, adaptation of the distorted RF signal to the intended target RF signal is enabled due to detecting the distorted RF signal, synchronizing the distorted RF signal and the input RF signal, and determining a second set of control parameters based on the comparison between the target RF signal and the distorted RF signal. Thus, adaptation of the plasma requirements without change of hardware becomes feasible.

Preferably, the steps of detecting at least one distorted RF signal; synchronizing the at least one distorted RF signal with the input RF signal; determining a difference between a target RF signal and the at least one distorted RF signal being synchronized; and determining a second set of control parameters based on the comparison of the target RF signal and the at least one distorted RF signal being synchronized are repeated as long as the difference is larger than the predetermined threshold. Thus, after each determination of a second set of control parameters, an adapted input RF signal is generated, and distortion of the adapted input RF signal is detected. If the deviation of the distorted RF signal from the target RF signal is larger than the predetermined threshold, a further second set of control parameters is determined to generate a further adapted input RF signal. This is continued until the deviation between the distorted RF signal and the target RF signal is small enough, i.e. the difference is below the predetermined threshold. Then, an adapted input RF signal has been found which ensures an RF signal at the plasma chamber sufficiently close to the target RF signal.

Preferably, the at least one distorted RF signal is detected at one or more of: an output of an RF generator, an input of an impedance matching network, an output of the impedance matching network and input for a plasma chamber, and/or in the plasma chamber. Thus, different detection techniques and detection locations in the plasma apparatus can be used in order to detect each of the distorted RF signals. Further, more than one distorted RF signal can be detected and used in order to determine the second set of control parameters in order to provide a reliable pre-compensation of the signal distortions to reduce the difference between the target RF signal and the distorted RF signal by the second set of control parameters.

Preferably, the input RF signal is modified to include one or more markers, wherein synchronizing the at least one distorted RF signal with the input RF signal includes detection of the marker in the distorted RF signal and determining the temporal delay between generating the marker of the input RF signal and detecting the marker in the distorted RF signal. Thus, by the marker the step of synchronization of the at least one distorted RF signal and the input RF signal is simplified and more reliable. Therein, different propagation times can be considered and included into the synchronization in particular for different detection locations in the plasma apparatus.

Preferably, the input RF signal is modified at predetermined points of time to include the marker. Therein, in particular the marker is included repeatedly in predetermined and preferably equal time intervals. For example, if the RF signal is a pulse pattern, the pulse pattern of the input RF signal may comprise a marker after every 1 to 1000 pulses, preferably after every 1 to 100 pulses and more preferably after every 1 to 10 pulses in order to provide sufficient information for synchronisation. Further, markers can be included in a unique sequence in order to be detected despite signal distortion due to the known sequence.

Preferably, the marker is in the time domain of the input RF signal, i.e. being provided by a temporal deviation of the input RF signal.

Preferably, if the marker is in the time domain, the marker has a temporal length of less than 10%, more preferably less than 5% and most preferably less than 1% of the pulse length of the RF input signal. Alternatively or additionally, the marker may have a duration between 0.001 ms and 10 ms and preferably between 0.01 ms and 1 ms. Thus, the marker is short and does not influence the plasma in the plasma chamber considerably.

Preferably, if the marker is in the time domain, the deviation is less than 10%, preferably less than 5%, and more preferably less than 1% of the amplitude of the input RF signal. Thus, already minor deviations of the input RF signal can be used as marker in order to provide a reliable synchronization between the input RF signal and the distorted RF signal.

Preferably, if the marker is in the time domain, the marker is arranged in an off-period of the input RF signal. In particular, due to the minor deviation of the marker from the input RF signal, in the off-period of the input RF signal, the marker has no considerable influences on the processes in the plasma chamber.

Preferably, if the marker is in the time domain and arranged in an off-period of the input RF signal, the amplitude of the marker is below the plasma ignition threshold. Thus, by the marker, the plasma will not be ignited or somehow influenced in order to provide a stable and predictable plasma processing.

Preferably, if the marker is in the time domain, the marker in the distorted RF signal is detected in the frequency domain of the distorted signal as spurious frequencies in the spectrum. Due to the short duration of the marker in the time domain, additional frequencies are generated temporarily which can be detected for a short period of time as spurious frequencies in the spectrum. Thus, a reliable and easy to implement way of detection of the marker is provided.

Additionally or alternatively, one or more of the markers are provided in the frequency domain of the input RF signal.

Preferably, if the marker is in the frequency domain, the marker is a phase shift of the input RF signal which is either persistent or temporary, or a frequency shift of the carrier RF signal which is temporary.

Preferably, if the marker is in the frequency domain, the marker is a phase shift of the input RF signal wherein the phase shift is less than 10°, preferably less than 5° and more preferably less than 1°. If several RF generators are employed together to provide power to the plasma, all generators have to provide the phase shift, which can be persistent or temporary, in a synchronized way. If only one of several generators is providing the phase shift, this phase shift has to be reversed to the original phase within a short time, preferably within less than 10 ms, preferably within less than 1 ms, and more preferably within less than 0.1 ms to avoid negative effects on the other generators and the plasma.

Preferably, the input RF signal includes at least one marker, wherein synchronizing the at least one distorted RF signal with the input RF signal includes detection of the marker in the distorted RF signal and determining the delay by the time difference between generating the marker in the input RF signal and detecting the marker in the at least one distorted RF signal, wherein the marker is a plasma ignition pulse and/or a unique feature of a input RF signal. Thus, features of the input RF signal which are already present can be used as marker for synchronization without adding additional features. Therein, the unique features in the input RF signal can be easily identified in order to determine the delay.

Preferably, in a first step of compensating the distortion of the RF signal, i.e. initiating the present method, the first set of control parameters can be determined in that the input RF signal is equal to the target RF signal. Alternatively, the first set of control parameters is given by a look-up table for a certain setup and a certain target RF signal. In this case, as a starting point, a first set of control parameters is provided for optimization wherein the input RF signal on the basis of the first set of control parameters might already deviate from the target RF signal in order to pre-compensate distortion of the input RF signal. Hence, upon executing the steps of the method for the first time, i.e. initialization of the plasma apparatus and/or implementing different plasma processes including, for example different target RF signals, the optimization might be initiated by selecting the first set of control parameters such that the input RF signal is equal to the target RF signal as starting point. For an already existing and implemented setup and already implemented plasma processes, i.e. target RF signals, upon change of a target RF signal, optimization can start on the basis of the first set of control parameters given by the lookup table enabling a faster optimization and adaption of the distorted RF signal to the target RF signal despite the given distortions.

Preferably, the second set of control parameters is stored in a lookup table if the difference between the at least one distorted signal and the target signal is smaller than the predetermined threshold. Then the second set of control parameters is stored in the lookup table to be used as a starting point for later optimization.

Preferably, the first set of control parameters and/or the second set of control parameters include one or more of an amplitude, a phase, a frequency (spectrum) and a temporal variation characterizing the RF signal to be provided to the plasma processes.

In a further aspect of the present invention, a controller is provided, in particular for an RF generator. The controller comprises a processing unit which is preferably built as digital signal processing unit (DSPU). An output interface is connected to the processing unit to provide control parameters to a direct digital synthesis (DDS) core, the output of which is used to drive the power stage of the RF generator. Further, the controller comprises a signal analysis unit preferably built as software defined radio (SDR) unit which is connected to the processing unit. With the signal analysis unit an input interface is connected to receive a distorted RF signal as sensor data from at least one sensor within the plasma apparatus. The processing unit is configured to provide a first set of control parameters corresponding to an input RF signal to the output interface. Further, the signal analysis unit is configured to receive from the input interface sensor data including at least one distorted signal and to deliver the amplitude modulation and/or the frequency spectrum of the signal to an input interface of the processing unit. The processing unit is configured to synchronize the at least one distorted signal with the input RF signal. Further, the processing unit is configured to determine a difference between a target RF signal and the at least one distorted signal being synchronized. Therein, the processing unit is further configured, based on a comparison of the target RF signal and the at least one distorted signal being synchronized, if the difference is larger than a predetermined threshold, to determine a second set of control parameters corresponding to an adapted input RF signal to be provided to the output interface. Thus, the difference between the target RF signal and the distorted RF signal is reduced.

Preferably, the input interface comprises at least one analog-to-digital converter (ADC) and, more preferably, comprises for each of the sensors one ADC or one channel of a multi-channel ADC.

Preferably, the processing unit and/or the DDS core and/or the signal analysis unit are built as field-programmable gate array (FPGA), complex programmable logic device (CPLD), application-specific integrated circuit (ASIC) or system on chip (SoC), wherein, preferably two or more of, and more preferably all of the processing unit, DDS core and signal analysis unit are integrally built by one FPGA, CPLD, ASIC or SoC. Thus, implementation of the processing unit, DDS core and the signal analysis unit is simplified and in particular a more versatile platform is provided in order to easily adapt the controller to specific applications.

Preferably, the output interface provides a control word for the direct digital synthesis (DDS) core. Thus, in particular, the first set of control parameters and/or the second set of control parameters are implemented by a DDS control word provided to the DDS core.

Further, it is an objective of the present invention to provide an RF generator for generating an RF signal for a plasma chamber. The RF generator comprises a frequency generation unit, preferably built as direct digital synthesis (DDS) core, to generate at least one RF signal.

In order to generate the at least one RF signal, the DDS core is connected to a digital-to-analog converter (DAC) which might be followed by a reconstruction filter. The RF signal can be an amplitude-modulated envelope of an RF base frequency in the time-domain (e.g. a pulse pattern) or a multi-frequency spectrum (e.g. a base frequency surrounded by additional frequencies) in the frequency domain.

Further, the RF signal at the output of the reconstruction filter is then amplified by a power amplifying stage to provide the output signal of the RF generator. The RF generator comprises an amplifier, connected to the frequency generation unit to amplify the at least one input RF signal. Therein, the amplifier is connected to an RF power output in order to provide the generated RF signal to a plasma chamber. Further, the RF generator comprises a controller as previously described.

Preferably, the frequency generation unit and the controller are integrally built by one FPGA, CPLD, ASIC or SoC.

Preferably, the RF generator comprises more than one RF power output for providing one or more amplified input signals to the plasma chamber, in particular via an impedance matching network. Therein, one common DDS core for all power outputs might be used. In particular, more than one DDS core and, more preferably, for each of the power outputs an individual DDS core is implemented in the RF generator.

Preferably, each of the DDS cores has a common controller as described before. Alternatively, more than one or each of the DDS cores have individual controllers as described before.

Preferably, the RF generator comprises more than one RF power output for providing the one or more amplified input RF signals to the plasma chamber, in particular via an impedance matching network. Therein, for all power outputs one common amplifier is implemented. In particular, more than one amplifier and, more preferably, for each of the power outputs an individual amplifier is implemented.

In a further aspect of the present invention, a plasma apparatus is provided comprising an RF generator for generating an input RF signal and a controller as previously described connected to the RF generator. Further, the plasma apparatus comprises an impedance matching network wherein an input of the impedance matching network is connected to an output of the RF generator. The plasma apparatus further comprises a plasma chamber wherein an input of the plasma chamber is connected to an output of the impedance matching network.

Preferably, the plasma apparatus comprises more than one RF generator for providing an input signal to the plasma chamber, wherein each RF generator has an individual controller, or is connected to one controller as common controller. Alternatively, several RF generators with individual controllers may be synchronized from one master RF generator.

DESCRIPTION OF THE INVENTION

Figure 1:
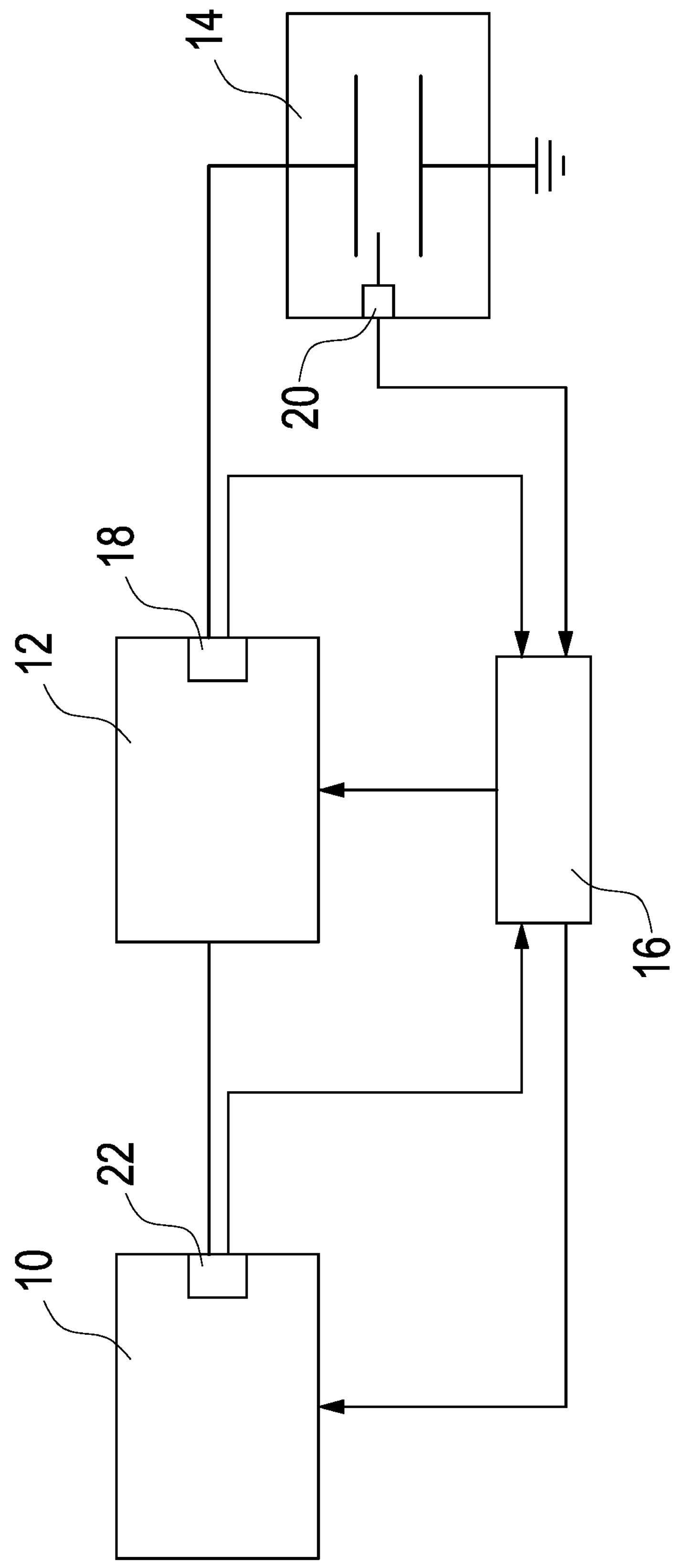
FIG. 1 a schematic drawing of a plasma apparatus according to the present invention, FIG. 2 a diagram of the method according to the present invention, FIG. 3A a target RF signal, FIG. 3B an adapted input RF signal according to the present invention, FIG. 3C a distorted RF signal for the input RF signal of FIG. 3B, FIG. 4 a comparison between an input RF signal and a distorted RF signal, FIGS. 5A-C an input RF signal in the time domain including a marker according to the present invention, FIG. 6A a spectrum of an adapted input RF signal according to the present invention, FIG. 6B a spectrum of an output RF signal for an adapted input RF signal as shown in FIG. 6A according to the present invention, and FIG. 7 a detailed embodiment of the plasma apparatus according to the present invention.

Referring to FIG. 1 showing a plasma apparatus comprising a radio frequency (RF) generator 10 generating an input RF signal fed by a transmission chain to a plasma chamber 14 in order to generate a plasma in the plasma chamber 14 for plasma processing.

Plasma processing is a very versatile and precise technique to modify the surfaces of exposed materials, e.g. by etching, coating or cleaning them. In particular, semiconductor wafers are coated and etched multiple times during the entire wafer process by using plasma processing tools which are typically operated with radiofrequency (RF) power. In such processing systems, RF power is used to excite gaseous compounds such that free electrons and ions are formed. Depending on a variety of process parameters, the plasma composition, i.e. the amount of ions, electrons, and neutrals in various states of excitation and their energy can be controlled both in steady state as well as in temporally varying operation. Therein, the process parameters are given in recipes and may change during treatment of exposed materials such as semiconductor wafers or the like. Therein, the process parameters are provided as target RF signal determining the characteristics of the plasma inside the plasma chamber 14.

The standardized output of an RF generator 10 of typically 50 Ohm cannot be directly connected to a plasma chamber since the plasma has a strongly varying impedance. This plasma impedance depends on its particular composition and the RF power level, and typically has resistance values significantly different from 50 Ohm and a reactance strongly deviating from zero. In consequence, automatic impedance matching networks 12 employing variable capacitors and inductors are used to continuously adapt the 50 Ohm output of the RF generator 10 to the varying plasma impedance. Whereas passive components like capacitors and inductors may behave linear, impedance matching networks 12 can also use non-linear devices, e.g. transformers, diodes, or varactors which can cause distortions. Thus, in the prior art, filters or other hardware components are implemented in order to supress spurious or harmonic frequencies and reduce distortions of the input RF signal. However, as mentioned before, during a specific recipe for treating a material in the plasma, the parameters may change several times requiring individual adaption of the input RF signal. Further, if recipes are changed, i.e. new process parameters shall be implemented, compensation of spurious and harmonic frequencies and/or further distortions of the input RF signal become mandatory resulting in the prior art in a change of hardware components which is costly and time consuming.

In accordance to the present invention, a controller 16 is implemented receiving sensor data from different sensors distributed in the plasma apparatus, wherein distortions of the input RF signal and deviation of the distorted RF signal from the target RF signal are detected. Thus, the controller is able to pre-compensate these distortions by adapting the input RF signal such that the distorted signal at the plasma chamber 14 is corresponding to the target RF signal, i.e. a difference between the target RF signal and the distorted RF signal after the transmission chain at the plasma chamber 14 is below a predetermined threshold. Therein, distortions of the input RF signal are caused by non-linearities of the amplifying stage of the RF generator, by non-linearities of the matching network, or by the highly non-linear characteristics of the plasma in the plasma chamber. Therein, the controller 16 may receive the distorted RF signal at an output of the RF generator 10, for example implemented as directional coupler (output sensor 22). Alternatively or additionally, controller 16 may receive as distorted RF signal the RF signal at the input of the impedance matching network 12, for example implemented as phase-and-magnitude detector (input sensor 44). Alternatively or additionally, controller 16 may receive as distorted RF signal the RF signal at the output of the impedance matching network 12, for example implemented as V-I-detector (output sensor 18). Alternatively or additionally the distortion of the RF signal may be detected directly within the plasma in the plasma chamber 14 by a plasma probe (plasma sensor 20), for example implemented as an antenna, a Langmuir probe, an optical sensor detecting the emitted plasma light, or other plasma diagnostics tools. By evaluating the detected sensor data of one or more of these sensors, the controller 16 determines an adapted input RF signal and controls the RF generator 10 to generate the adapted input RF signal comprising a pre-compensation of the distortions in the transmission chain from the RF generator 10 to the plasma chamber 14, thereby matching the distorted RF signal at the plasma chamber 14 and the intended target RF signal of the recipe despite the non-linear distortions within a plasma apparatus.

Further, the controller 16 might control the impedance matching network 12 by a match control 25 in order to perform impedance matching between the RF generator 10 and the plasma chamber 14 also influencing the distortion of the input RF signal by the impedance matching network 12. Thus, knowledge about the impedance matching process is accessible by the controller 16 which can also be used as sensor data by the controller 16 in order to determine the adapted input RF signal for pre-compensation of the distortions. The controller 16 can be a stand-alone unit or preferably be integrated into the RF generator or into the matching network.

Figure 2:
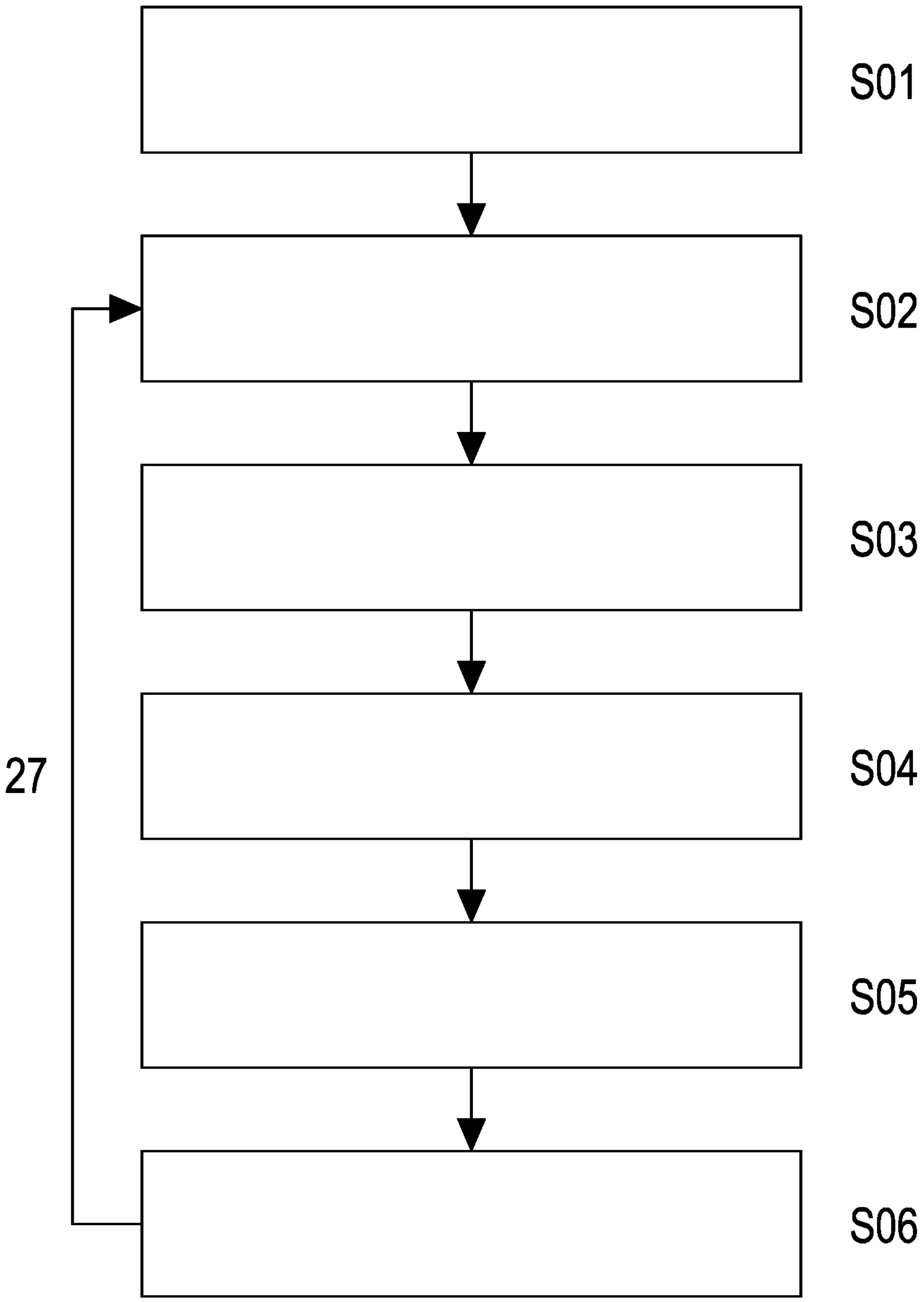

Referring to FIG. 2, showing a diagram of the method according to the present invention. In accordance to the method, an RF signal is generated for a plasma chamber.

According to step S01, an input RF signal is generated on the basis of a first set of control parameters. Therein, preferably during initialization of the present method, the input RF signal is determined according to the target RF signal. The first set of control parameters might be given by a lookup table for a certain setup and certain target RF signal. The input RF signal is provided to the plasma chamber but distorted by non-linear elements in the transmission chain.

According to step S02, at least one distorted RF signal is detected within the plasma apparatus. Therein, one or more sensors may be implemented in the plasma apparatus in order to provide sensor data of the distorted RF signal. Thereby, it is not necessary to directly measure the distorted RF signal. It is possible to detect the distortion of the input RF signal indirectly, for example by a change of the plasma parameters within the plasma chamber 14 or the like.

According to step S03, the at least one distorted RF signal is synchronized with the input RF signal, thereby determining the signal delay time between the input RF signal generated by the RF generator 10 and the location of the detection, for example, but not limiting, at the output of the RF generator 10, at the input of the impedance matching network 12, at the output of the impedance matching network, or in the plasma chamber 14. Thus, temporal matching between the at least one distorted RF signal and the input RF signal is achieved.

According to step S04, a difference is determined between the target RF signal and the at least one distorted RF signal being synchronized. Since no delay exists between the target RF signal and the input RF signal, determining the difference between target RF signal and the at least one distorted RF signal can be facilitated due to temporal matching between the at least one distorted RF signal and the target RF signal according to step S03.

According to step S05, if the difference between the target RF signal and the distorted RF signal is larger than the predetermined threshold, a second set of control parameters is determined based on a comparison of the target RF signal and the at least one distorted RF signal being synchronized. Thus, if the distorted RF signal detected according to step S02 is not similar enough to the target RF signal or deviating from the target RF signal too much, a second set of control parameters is determined. Therein, determining the second set of control parameters can be performed by an algorithm for example based on machine learning or artificial intelligence, matching the difference between the distorted RF signal and the target RF signal to an adaption of the set of control parameters.

According to step S06, an adapted input RF signal is generated by the RF generator 10 on the basis of a second set of control parameters such that the difference between the target RF signal and the distorted RF signal is reduced. Thus, by the adapted input RF signal, pre-compensation of the distortion in the transmission chain between the RF generator 10 and the plasma chamber 14 is achieved, and an RF signal very close to the intended target signal is applied to the plasma.

Therein, determining the second set of control parameters on the basis of the comparison between the target RF signal and the synchronized distorted RF signal may involve an algorithm such as trial and error approach with systematic variation of the control parameters. If a small change of a parameter value reduces the distortion, continue in the same direction; otherwise, change the parameter in the other direction. Further, a self-learning algorithm might be implemented for optimized iterations towards optimum settings, including storing distortion characteristics and best control parameters in a lookup table for use in similar situations. Further, a transformation function might be calculated from the required and the resulting waveform, respectively, and then, the inverse transformation function may be applied to the distorted output waveform for calculating a pre-distorted/pre-compensated waveform for the RF generator. Further, distortion compensation for each sample may be applied including generating a lookup table of original versus distorted envelope values for each sample/point in time, and calculating pre-compensating envelope values for each sample. Then this lookup table is used to generate a predistorted/pre-compensating waveform with the RF generator. Further, distortion compensation for groups of samples may be applied. Therein, averages are calculated for suitable groups of samples to reduce noise, and a lookup table is generated including original versus distorted envelope values for each sample/point in time by using an identical average value for the respective group of samples. Then, the predistorted/pre-compensating envelope value for each group of the sample is calculated, and this lookup table is then used to generate a predistorted/pre-compensating waveform with the RF generator. Further, frequency domain distortion compensation may be applied, including the above described algorithms for time-domain corrections being applied to the frequency domain in an adapted way, by applying the algorithms to individual frequencies, e.g. spurs and harmonics, in the spectrum and generating the same frequencies with one or more RF generators with opposite phase.

Opposite phase in this context means that a phase shift is applied to the signal from the RF generator such that, combined with further phase shifts due to delay times in cables and/or phases shifts due to other components in the transmission chain, it results in an RF signal of opposite phase in the plasma. In this way, spurs and harmonics in the plasma are suppressed.

Frequencies and phase-shift values can be stored in lookup tables and optimized in further iterations. Therein, one or more of the algorithms can be combined in order to determine a second set of control parameters on the basis of the comparison between the target RF signal and the distorted RF signal.

In accordance to FIG. 2, if an adapted input RF signal is generated on the basis of a second set of control parameters, the method may be repeated according to arrow 27 with repeating the steps S02 to S06 in order to generate further second sets of control parameters until the difference between the distorted RF signal detected according to step S02 and the target RF signal is below the predetermined threshold. If a distortion of the RF signal in the plasma apparatus is successfully pre-compensated, the second set of control parameters might be stored in a lookup table and can be used in a further optimization for a same or similar setup and same or similar target RF signal. Therein, the second set of control parameters successfully pre-compensating the distortion in the transmission line of the plasma apparatus is used as starting point, i.e. first set of control parameters generating the initial input RF signal. In this case the initial input RF signal used for initialization of the method according to the present invention might already deviate from the target RF signal due to predistortion. However, since compensation of the distortion for the specific target RF signal and setup is already approximated, optimization can be accelerated.

Hence, in accordance with the present invention, upon a change of the plasma parameters in a given recipe, compensation of the distortion of the RF signal is facilitated reliably and quickly without specific adaption of the hardware in order to provide reliable and stable plasma conditions, i.e. coating, etching, cleaning or otherwise modifying an exposed material by the plasma by a pure and stable frequency with a specific power level. Thus, also a change of the recipe to other plasma parameters can be easily carried out due to compensation of upcoming distortions.

Therein, the first set of control parameters and/or the second set of control parameters may include one or more of an amplitude of the RF signal, a phase of an RF signal, a frequency or frequency spectrum and/or a temporal variation.

Figure 3A:
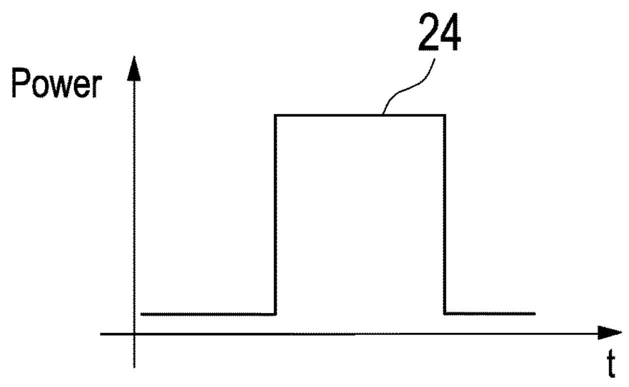
Figure 3B:
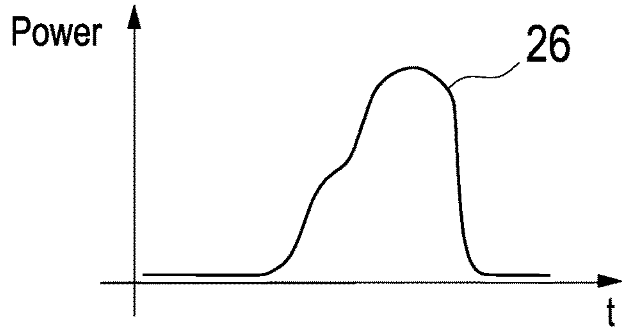
Figure 3C:
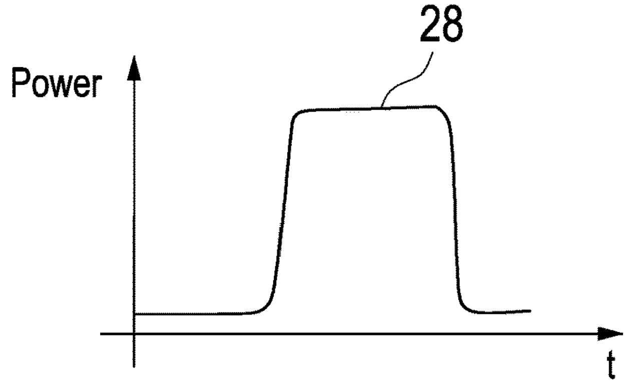

Due to the method according to the present invention, the input RF signal is adapted in order to achieve an almost undistorted target RF signal within the plasma chamber 14. The situation is depicted in FIGS. 3A, 3B, and 3C. Referring to FIG. 3A, the target RF signal 24 is shown which is to be presented to the plasma chamber, whereas FIG. 3B shows the adapted input RF signal 26 which is predistorted according to the present invention in order to compensate for distortions in the transmission line between the RF generator 10 and the plasma chamber 14. Therein, the adapted input RF signal 26 is shaped such that the distorted RF signal 28 depicted in FIG. 3C, after undergoing the signal distortions in the transmission line, matches the target RF signal as much as necessary for the specific application. Referring to FIG. 3C, the distorted RF signal 28 at the plasma chamber 14 is shown which is equal or at least very close to the target RF signal, i.e. the difference between the distorted RF signal 28 and the intended target RF signal is below a determined threshold. Therein, the threshold can be specifically shaped according to the intended application, and can be larger for more insensitive applications such as cleaning or the like, and can be smaller for sensitive applications such as material etching and/or deposition. Therein, from FIGS. 3A, 3B and 3C, it is apparent that the input RF signal 26 might already deviate from the target RF signal 24 due to the intended pre-compensation by predistortion of the input RF signal 26.

Figure 4:
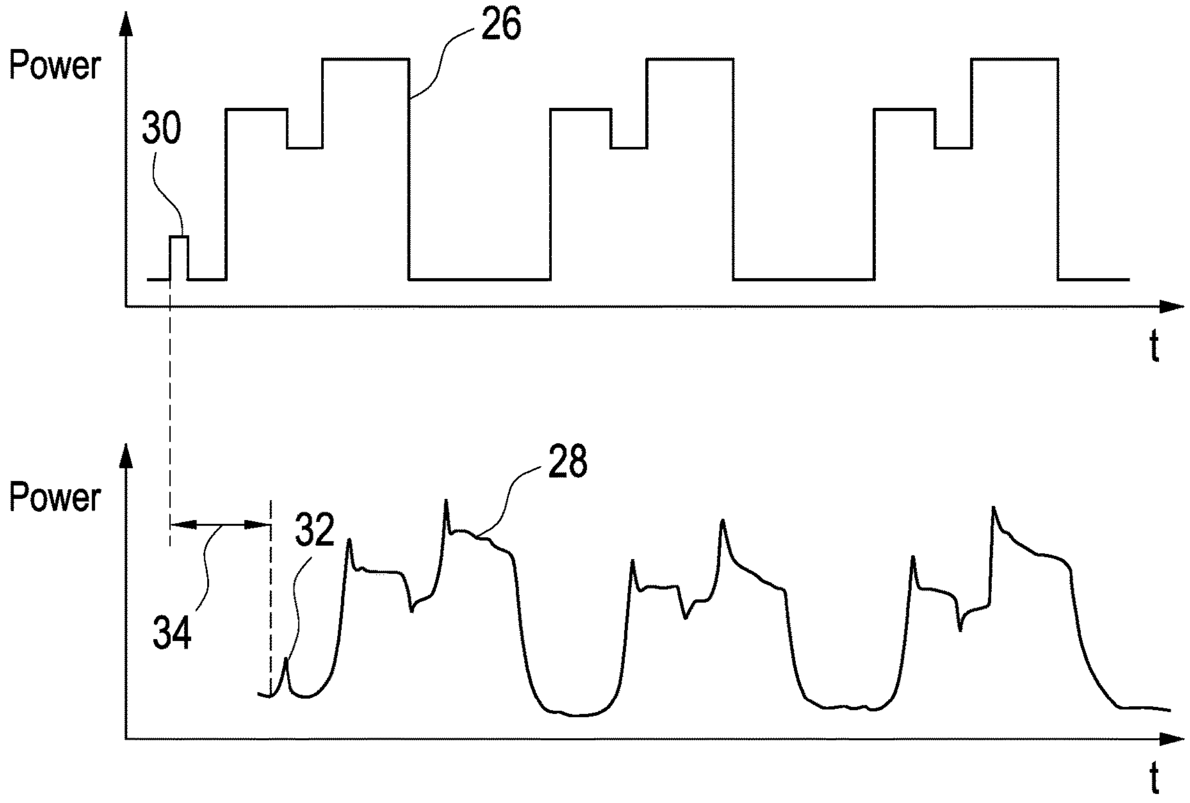

In order to facilitate synchronization between the input RF signal 26 and the distorted RF signal 28 to enable comparison of the distorted RF signal 28 with the target RF signal, synchronization is performed by a specific and unique feature within the RF signal. By using such a specific and unique feature, the time delay between input RF signal and measured distorted RF signal imposed by the transmission chain and possibly further delays due to processing of the sensor signal, can be determined. Therein, this unique feature might be a plasma ignition pulse or, alternatively, synchronization might be performed for pulsed applications with lower repetition rates with the pulse itself. However, if the repetition rate of the pulses is high, separation of the individual pulses might not be possible anymore. Referring to FIG. 4, in an embodiment, a marker 30 is added to the input RF signal 26 which is received in the distorted RF signal 28 as distorted marker 32 after a time delay 34 corresponding to the signal propagation time of the input RF signal 26 from the RF generator 10 to the location of detection of the distorted RF signal 28, and possibly a further delay due to transmission and processing of the sensor signal. Thus, by the time delay 34 between the marker 30 in the input RF signal 26 and the distorted marker 32 in the distorted RF signal 28, synchronization can be performed. After synchronization, the distorted RF signal 28 can be compared with the target RF signal 24 in order to determine the difference between the distorted RF signal 28 and the target RF signal.

Figure 5A:
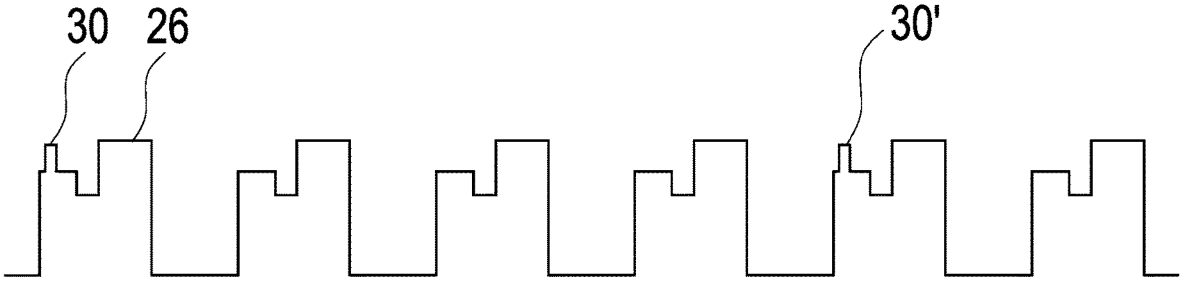
Figure 5B:
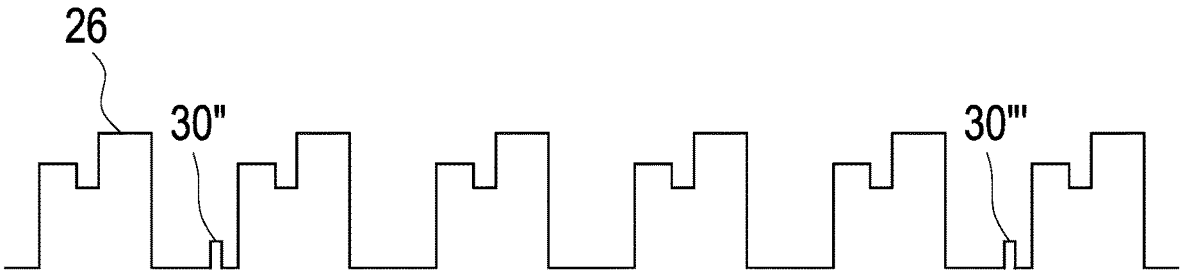

Referring to FIGS. 5A and 5B, different positions and forms of the marker 30 are possible and the present invention is not limited to a specific position or form of the marker in the input RF signal. Therein, the marker 30 is short with respect to the pulse length of the input RF signal and might have a length of only 0.001 ms to 10 ms and preferably between 0.01 ms and 1 ms. In other words, the duration of the marker 30 is preferably less than 10%, more preferably less than 5% and most preferably less than 1% of the pulse length of the input RF signal 26. Additionally or alternatively, the amplitude of the marker 30 is small in comparison with the amplitude of the input RF signal 26. Therein, the marker 30 might have less than 10%, preferably less than 5% and more preferably less than 1% of the amplitude of the input RF signal. Thus, the marker does not influence the generated plasma in the plasma chamber 14 and is only implemented in the input RF signal 26 for the purpose of synchronization of the distorted RF signal 28 with the input RF signal 26. Referring to FIG. 5A, the marker 30 can be located on top of a pulse of the input RF signal 26 and might be repeated as repeated marker 30'. Repetition of the marker 30 might be included in the input RF signal periodically and preferably in predetermined and/or fixed time intervals. Alternatively, the marker 30" might be located in an off-period of the input RF signal 26 and might also be repeated periodically as repeated marker 30'". In both cases of FIG. 5A and FIG. 5B, influence on the generated plasma is avoided and, in particular, in FIG. 5B, the amplitude of the marker is below the plasma ignition threshold.

Figure 5C:
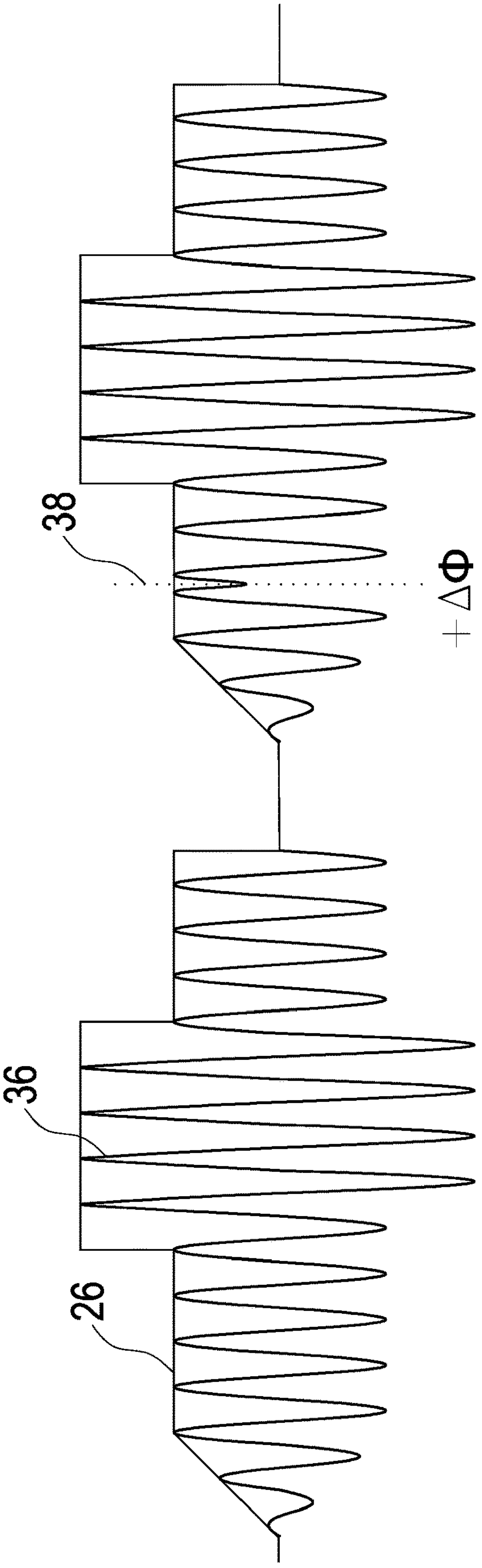

Referring to FIG. 5C, an input RF signal 26 as envelope of the oscillating RF signal 36 is shown, wherein the marker might be built in as phase shift 38 in the fast oscillating signal. Therein, the phase shift $\Delta\varphi$ might be either persistent or temporary. Thus, synchronization between the input RF signal 26 and the distorted RF signal 28 is performed by detecting the phase shift 38. Therein, the phase shift might be a phase shift small enough to not cause negative effects on the plasma, the RF generator, or the plasma apparatus, e.g. less than 10°, preferably less than 5° and more preferably less than 1°.

Alternatively, a temporary shift of the RF carrier frequency in the range of e.g. less than 5%, preferably of less than 2%, and more preferably of less than 1% of the RF carrier frequency has a similar effect on the frequency spectrum as a temporary phase shift.

Figure 6A:
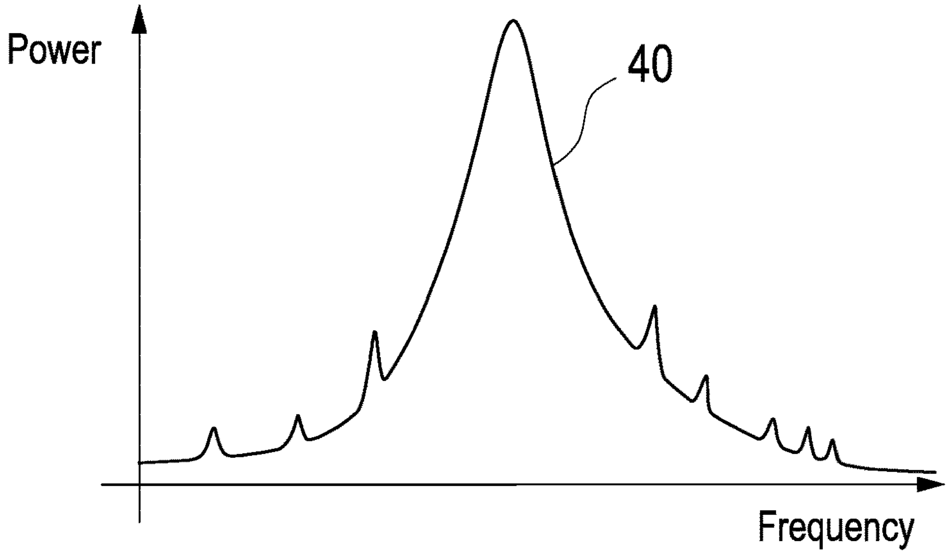
Figure 6B:
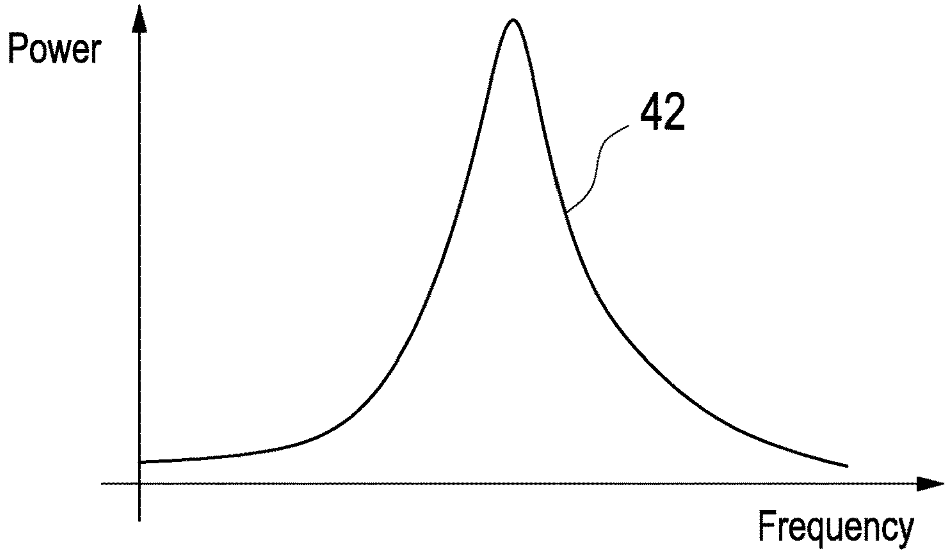

Referring to FIG. 6, pre-compensation of distortions due to non-linearities in the transmission chain from the RF generator 10 to the plasma chamber 14 is shown in the power spectrum 40. For example, in order to supress spurious frequencies or higher harmonics, the spectrum 40 of the input RF signal might be predistorted according to FIG. 6A by already including additional frequencies. However, during transmission of the input RF signal from the RF generator 10 to the plasma chamber 14, the spectrum is distorted by the non-linear elements within the transmission chain and, in particular, by the power amplifier of the RF generator 10, the impedance matching network 12, or the plasma itself. Therefore, specific frequencies are suppressed which may relate to the previously added frequencies in the spectrum 40 of the adapted input RF signal. Thus, at the plasma chamber, the distorted signal has a spectrum 42 without spurious or harmonic frequencies, thus providing a reliable and stable plasma in accordance to the target RF signal. Therein, pre-compensation of the frequency spectrum and pre-compensation of the temporal RF signal envelope in the time domain can be used alternatively or combiningly in order to generate a desired stable plasma for reliable processing of the exposed material.

Figure 7:
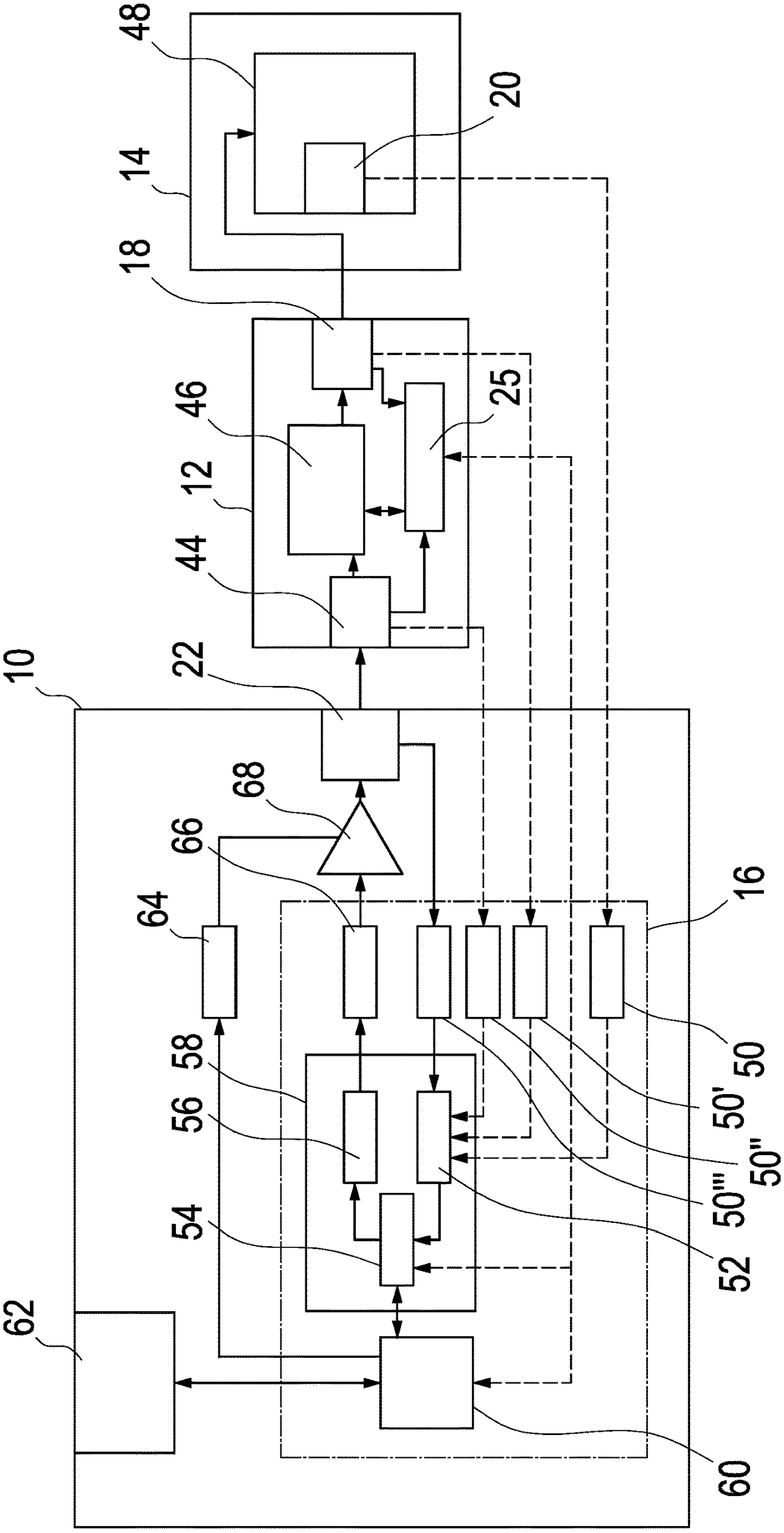

Referring to FIG. 7, wherein same or similar elements are indicated with the same reference signs as in FIG. 1: The controller 16 generates an input RF signal which is amplified by the power amplifier 68 and further transferred to the impedance matching network 12 comprising an impedance matching circuit 46. The impedance matching circuit 46 is controlled by a match control 25, receiving information from an input sensor 44 and an output sensor 18, and controlling the impedance matching circuit on the basis of the received sensor data of the input sensor 44 and the output sensor 18. Therein, the input sensor 44 might be built as phase-magnitude-sensor. The impedance matching network 12 is connected to a plasma processing system 48 including a plasma chamber 14. Information from the input sensor 44 of the impedance matching network 12 and the output sensor 18 of the impedance matching network 12 is fed back as sensor data to the controller 16. In addition, in the plasma chamber 14, a plasma sensor 20 is arranged detecting the plasma condition or plasma parameters. The plasma sensor might be built as an antenna, as a Langmuir probe, might be an optical sensor detecting the plasma light, or any other plasma diagnostics tool. Sensor data of the plasma sensor 20 is fed back to the controller 16. Sensor data from the sensors 18, 20, 44 are then digitalized by analog-to-digital converters (ADCs) 50, 50', 50" and are used each as distorted RF signals. Therein, the ADCs can be realized as multiple single-channel ADCs, or a multi-channel ADC, or a combination thereof. In particular, at the output of the power amplifier 68, a directional coupler is disposed as output sensor 22 of the RF generator 10 which is also used as sensor in order to feed back sensor data via ADC 50". Alternatively, the sensors 18, 20, 22, 44 may include individual ADCs and transfer digital information to the controller 16.

By a signal analysis unit 52, in particular built as software defined radio (SDR) unit, in combination with a processing unit 54, in particular built as digital signal processing unit (DSPU), synchronization between the received distorted RF signals from the sensors and the input RF signal is provided. The DSPU 54 might further receive information from the match control 25 and/or a processor of the controller 16, such as a lookup table or the like. Further, the processor 60 of the controller 16 might be connected to a user interface 62 for exchange of parameters which are also provided to the processing unit 54. By the user interface 62, recipes and, in particular, process parameters might be defined and monitored.

By the processing unit 54, comparison between the target RF signal and the received distorted RF signal is performed. In particular, by the DSPU 54, the first set of control parameters is determined on the basis of the target RF signal, for example by a lookup table stored in a memory of controller 16. Further, by the processing unit 54, also the second set of control parameters is determined on the basis of the comparison between the distorted RF signal and the target RF signal according to an algorithm as previously described. Therein, the control parameters are provided to a frequency generation unit 56, preferably built as direct digital synthesis unit (DDS) in order to generate at least one or more input RF signals. Therein, handover of the set of parameters might be performed as DDS control word. The input RF signal generated by the frequency generation unit 56 is then converted from digital to analog by a digital-to-analog converter 66, typically followed by a reconstruction filter, and then amplified by a power amplifier 68. Therein, the DC voltage supply 64 of the power amplifier 68 might also be controlled by the controller 16 in order to adapt the input RF signal accordingly for the pre-compensation of the distortion in the transmission chain. Alternatively the DC voltage supply 64 might be set up based on the recipe. Its power level is then typically not adapted during pulse-mode operation.

Although, in FIG. 7 only one power amplifier 68 is shown, the RF generator 10 might comprise more than one power amplifier 68 and thus also more than one power output wherein one or more of these power outputs can comprise a directional coupler as output sensor 22 for detecting sensor data in order to be able to detect distortion of the input RF signal by the respective power amplifier 68.

Although, in FIG. 7 only one power amplifier 68 is shown, the RF generator 10 might comprise more than one power amplifier 68 and thus also more than one power output wherein one or more of these power outputs can comprise a directional coupler 22 as sensor for detecting sensor data in order to be able to detect distortion of the input RF signal by the respective power amplifier 68.

Further, the signal analysis unit 52, the processing unit 54, and the frequency generation unit 56 might be preferably integrally combined into one entity 58, by a field-programmable gate array (FPGA), a system on chip (SoC), a complex programmable logic device (CPLD), or an application-specific integrated circuit (ASIC). In general, these components are built as a versatile platform in order to be able to provide compensation of distortion in the transmission chain of the plasma apparatus and for a large number of possible plasma parameters of different recipes or within the same recipe.

The invention claimed is:

1. A method for generating an RF signal preferably for a plasma chamber comprising the steps of:

generating an input RF signal on the basis of a first set of control parameters;

detecting at least one distorted RF signal;

synchronizing the at least one distorted RF signal with the input RF signal;

determining a difference between a target RF signal and the at least one distorted RF signal being synchronized;

if the difference is larger than a predetermined threshold, determining a second set of control parameters based on a comparison of the target RF signal and the at least one distorted RF signal being synchronized; and generating an adapted input RF signal on the basis of the second set of control parameters such that the difference between the target RF signal and the distorted RF signal is reduced, wherein the input RF signal is modified to include a marker, wherein synchronizing the at least one distorted RF signal with the input RF signal comprises: detecting the marker in the distorted RF signal and determining the delay by the time difference between generating the marker in the input RF signal and detecting the marker in the distorted signal.

2. The method according to claim 1, wherein the steps of detecting the at least one distorted RF signal; synchronizing the at least one distorted RF signal with the input RF signal; determining the difference between the target RF signal and the at least one distorted RF signal being synchronized; determining the second set of control parameters based on the comparison of the target RF signal and the at least one distorted RF signal being synchronized; and generating the adapted input RF signal on the basis of the second set of control parameters are repeated as long as the difference is larger than the predetermined threshold.

3. The method according to claim 1, wherein the at least one distorted RF signal is detected at one or more of: an output of an RF generator, an input of an impedance matching network, an output of the impedance matching network, an input of the plasma chamber, and in the plasma chamber.

4. The method according to claim 3, wherein the marker is in the time domain of the input RF signal and/or the frequency domain of the input RF signal.

5. The method according to claim 4, wherein if the marker is in the time domain, the marker is arranged in an off-period of the input RF signal and/or the amplitude of the marker is below the plasma ignition threshold.

6. The method according to claim 4, wherein if the marker is in the time domain, the marker in the distorted RF signal is detected in the frequency-domain of the distorted signal as spurious frequencies in the spectrum.

7. The method according to claim 4, wherein if the marker is in the frequency domain, the marker is a phase shift of the input RF signal which is either persistent or temporary, and/or a frequency shift of the carrier frequency of the RF signal which is temporary.

8. The method according to claim 1, wherein the input RF signal comprises a marker, wherein synchronizing the at least one distorted RF signal with the input RF signal comprises: detecting the marker in the distorted RF signal and determining the delay by the time difference between generating the marker in the input RF signal and detecting the marker in the distorted RF signal, wherein the marker is a plasma ignition pulse or a unique feature of the input RF signal.

9. The method according to claim 1, wherein the first set of control parameters is given by a look-up table for a certain setup and a certain target RF signal.

10. The method according to claim 1, wherein the second set of control parameters is stored in a look-up table if the difference between the at least one distorted RF signal being synchronized, and the target RF signal is smaller than the predetermined threshold.

11. The method according to claim 1, wherein the first set of control parameters and/or the second set of control parameters comprise one or more of an amplitude, a phase, a frequency and a temporal variation.

12. A controller, in particular for an RF generator, comprising:

a processing unit, preferably a digital signal processing unit, DSPU, an output interface connected to the processing unit to provide control parameters to a frequency generation unit, a signal analysis unit, preferably a software defined radio unit, SDR, connected to the processing unit; and an input interface connected to the signal analysis unit and connectable to at least one sensor to receive at least one distorted RF signal as sensor data from the at least one sensor, wherein the processing unit is configured to provide a first set of control parameters corresponding to an input RF signal to the output interface;

wherein the signal analysis unit is configured to receive from the input interface sensor data comprising the at least one distorted RF signal;

wherein the processing unit is configured to synchronize the at least one distorted RF signal with the input RF signal;

wherein the processing unit is further configured to determine a difference between a target RF signal and the at least one distorted RF signal being synchronized; if the difference is larger than a predetermined threshold, determining a second set of control parameters corresponding to an adapted input RF signal based on a comparison of the target RF signal and the at least one distorted RF signal being synchronized; and providing the second set of control parameters to the output interface, wherein the input RF signal is modified to include a marker, wherein synchronizing the at least one distorted RF signal with the input RF signal comprises: detecting the marker in the distorted RF signal and determining the delay by the time difference between generating the marker in the input RF signal and detecting the marker in the distorted signal.

13. The controller according to claim 12, wherein the processing unit and/or the signal analysis unit and/or the frequency generation unit are built as FPGA, CPLD, ASIC or SoC, wherein preferably, the processing unit and the signal analysis unit are integrally built by one FPGA, CPLD, ASIC or SoC.

14. The controller according to claim 12, wherein the output interface provides a direct digital synthesis (DDS) unit control word.

15. An RF generator for generating an RF signal for a plasma chamber, comprising:

a frequency generation unit, preferably built as direct digital synthesis core, DDS core, to generate at least one input RF signal;

an amplifier connected to the frequency generation unit to amplify the at least one input RF signal; and a controller according to claim 12 connected to the frequency generation unit.

16. The RF generator according to claim 15, wherein the frequency generation unit and the controller, in particular the processing unit and/or the signal analysis unit, are integrally built by one FPGA, CPLD, ASIC or SoC.

17. A plasma apparatus comprising an RF generator for generating an input RF signal, a controller according to claim 12 connected to the RF generator;

an impedance matching network, wherein an input of the impedance matching network is connected to an output of the RF generator; and a plasma chamber, wherein an input of the plasma chamber is connected to an output of the impedance matching network.

18. The plasma apparatus according to claim 17, wherein more than one RF generator each providing the input RF signal to the plasma chamber, wherein preferably each RF generator is connected to one controller as common control.

* * * * *